United States Patent [19]

Pearce

[11] Patent Number: 4,890,107
[45] Date of Patent: Dec. 26, 1989

[54] ANALOGUE-TO-DIGITAL CONVERTER

[75] Inventor: Timothy H. B. Pearce, Springfield, United Kingdom

[73] Assignee: The General Electric Company, p.l.c., London, United Kingdom

[21] Appl. No.: 166,559

[22] Filed: Mar. 10, 1988

[30] Foreign Application Priority Data

Mar. 12, 1987 [GB] United Kingdom ............... 8705923

[51] Int. Cl.[4] .......................................... H03M 13/00
[52] U.S. Cl. ..................................... 341/156; 341/118
[58] Field of Search ................................ 341/118, 156

[56] References Cited

U.S. PATENT DOCUMENTS 3,967,269  6/1976  Fletcher .

FOREIGN PATENT DOCUMENTS 1516001  6/1978  United Kingdom .
1536024  12/1978  United Kingdom .
1572637  7/1980  United Kingdom .
2138228  10/1984  United Kingdom .
2179812  3/1987  United Kingdom .

OTHER PUBLICATIONS

"Notes on Analog-Digital Conversion Techniques", Alfred K. Susskind, 1957, pp. 1-6, The Technology Press, M.I.T.

Primary Examiner—William M. Shoop, Jr.
Assistant Examiner—Helen Kim
Attorney, Agent, or Firm—Spencer & Frank

[57] ABSTRACT

An analogue-to-digital converter in accordance with the invention comprises a feed-forward arrangement in which, in a first stage, the analogue input signal is applied via a filter to a subtractor along a first path and is applied via a second path to an analogue-to-digital converter followed by a digital filter and then converted back into analogue form to be applied via a bandpass filter to the subtractor. The output of the subtractor is therefore an error signal representative of the difference between the analogue input signal and the predicted signal in analogue form. The error signal is applied to an analogue-to-digital converter and is combined with the predicted signal in digital form taken from the output of the digital filter via another filter to produce the digital output signal. Control means are provided to provide phase and gain matching between different parts of the circuit. The digital filter is such that its output noise spectrum is arranged to be shaped so as to include a null around the quarter sampling frequency, enabling the following D-A converter to be of low resolution.

29 Claims, 4 Drawing Sheets

ANALOGUE-TO-DIGITAL CONVERTER

BACKGROUND OF THE INVENTION

This invention relates to an analogue to digital converter.

An analogue to digital converter for converting an analogue input signal of narrow bandwidth to digital form based on a feedback arrangement is described in our UK patent application No., GB-A-8530669.

SUMMARY OF THE INVENTION

The present invention is concerned with an analogue to digital converter based on a feedforward arrangement which aims to achieve 16 bit resolution at a sampling frequency fs of at least 10 MHz.

According to the invention there is provided an analogue-to-digital converter comprising a first stage including means for producing a predicted signal in digital form of an analogue signal at its input, and means for determining a band limited error signal representing the difference between the predicted signal and the input signal by comparing them in analogue form; and a second stage comprising means for combining the error signal with the predicted signal to obtain a digital output signal. By "band limited" it is meant that the error signal bandwidth is less than half the sampling frequency. An analogue-to-digital converter in accordance with the invention does not require a sample and hold circuit at its input and therefore reduces the errors in sample amplitude which might occur because of jitter. It avoids instability difficulties experienced with previous arrangements and retains more of the signal in analogue form, band limited to less than half the sampling frequency fs. This optimises the linearity and noise performance. The invention may be applied to both converters having narrow bandwidth input signal and those to which wide bandwidth signals, up to approximately half the sampling frequency, are applied. In the case of a converter for narrowband signals, apparatus in accordance with the invention enables a lower cost digital- to- analogue converter to be used than with previous arrangements.

Preferably, the first stage includes a first signal path along which the analogue signal is transmitted to the said means for determining an error signal, and a second signal path which includes analogue-to-digital converter means followed by digital-to-analogue converter means, the predicted signal in digital form being passed to the second stage and the output of the digital-to-analogue converter means being applied to said means for determining a band limited error signal.

It is preferred that the second stage comprises a first signal path which includes analogue-to-digital conversion means to which the error signal is applied, and a second signal path along which the predicted signal in digital form is transmitted.

It is desirable that the error signal be made as small as possible so as to prevent overloading of components to which it is subsequently applied and in particular the analogue-to-digital converter means. The error signal will be minimised where matching between paths in the first stage is perfect. Advantageously therefore, there are included means for adding a pilot signal to the analogue signal at the input of the converter; means for monitoring the amplitude of the pilot signal present in the error signal; and means for using the result of the monitoring to improve phase and amplitude matching between signal paths in the first stage. It is also preferred that there are included means for adding a test signal to the predicted signal in digital form in the first stage, means for comparing the test signal taken from the second stage with the test signal passed along a signal path not included in the first and second stages, and means for using the result of the comparison to improve phase and amplitude matching between signal paths in the second stage. Advantageously, the characteristics of two paths followed by the test signal are substantially the same to enable suitable matching to be achieved. Matching between signal paths may be improved by applying phase and gain control to elements in the signal paths in dependence on the result obtained. Thus, preferably, means are included for controlling the clock phase and reference voltage of analogue-to-digital conversion means to improve matching between signal paths.

In one embodiment of the invention, it is preferred that delay means are included in the first stage via which the analogue input signal is transmitted to the means for determining the error signal. This is particularly applicable to wide band input signals.

For applications to signals occupying a bandwidth appreciably less than half the sampling frequency fs, it is preferred that digital filter means are included in the first stage to which the predicted signal in digital form is applied. This enables the prediction error to be minimised over a limited bandwidth without the need for a significant matching delay in the analogue signal path in the first stage. Advantageously, the output noise spectrum of the digital filter means is arranged to be shaped so as to include a null around the same limited passband. Advantageously, digital-to-analogue converter means is arranged to follow the digital filter means and has a resolution less than that of the analogue-to-digital converter means in the first stage and advantageously a resolution of only one bit.

BRIEF DESCRIPTION OF THE DRAWINGS

Some ways in which the invention may be performed are now described by way of example, with reference to the accompanying drawings, in which.

DESCRIPTION OF PREFERRED EMBODIMENTS

Figure 1:
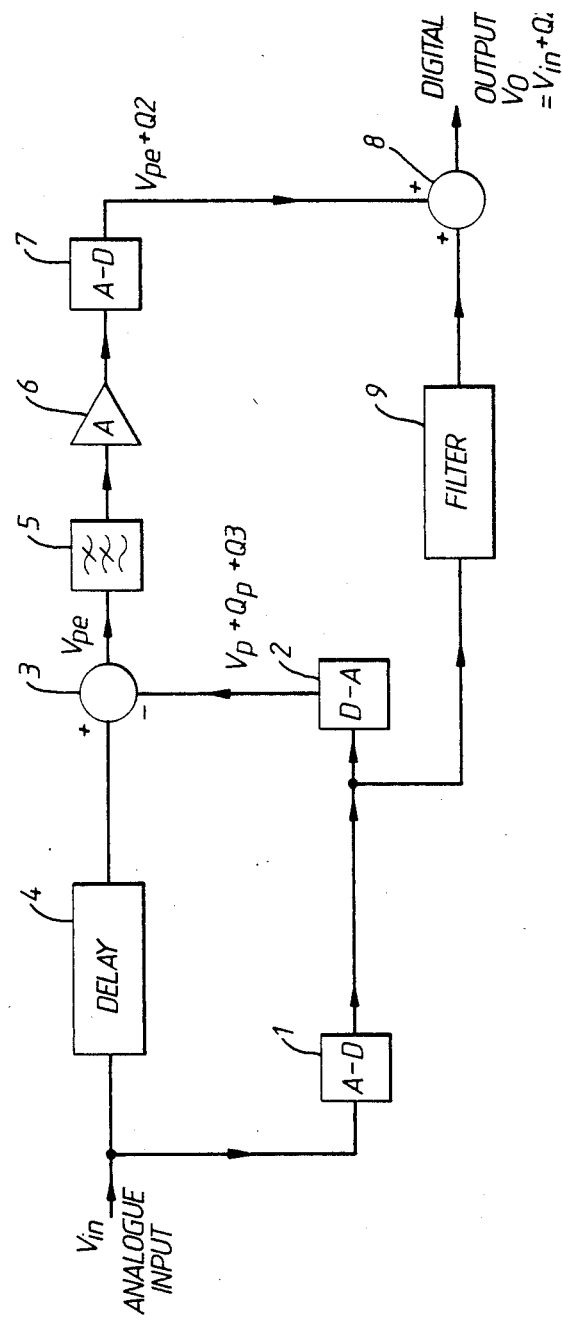
FIGS. 1 and 2 are schematic block diagrams of an A-D converter in accordance with the invention.

FIG. 1 shows the basic arrangement of a converter in accordance with the invention which is suitable for use with wideband input signals. The arrangement is designed for a wideband signal which is retained in analogue form through a first stage so that no sample and hold circuit is required at the converter input. The quantised prediction of the input signal, although sampled during the quantisation process, is returned to analogue form before subtraction from the input signal. The subtractor thus only passes the band limited prediction error, which minimises the slew rate and hence aperture jitter requirements at the point of sampling in the second stage.

The prediction $V_p$ in the first stage is derived from the input signal $V_{in}$ via an 8 bit parallel (flash) A-D converter 1, sampled at the converter sampling rate fs and then passed to an 8-bit D-A converter 2 whose output is an analogue prediction signal $V_p$ with added quantisation noise $Q_p$. The prediction error $V_{pe}$ is obtained by subtraction of the prediction $V_p$ from the input signal $V_{in}$ at a subtractor 3, the input signal $V_{in}$ being applied via a matching delay 4.

The prediction error $V_{pe}$ is passed through a low pass filter 5 and amplifier 6, sampled and quantised by an 8-bit parallel (flash) A-D converter 7 at the sampling frequency fs and is then added digitally at 8 to the quantised prediction $V_p$ obtained from the A-D converter 1 in the first stage via a digital filter 9 to provide the converter output $V_o$. Matching of the two signal paths in the first stage is necessary to reduce the magnitude of the prediction error $V_{pe}$ to a level within the range of the second stage A-D converter 7, while matching of the second stage signal paths is necessary to suppress the quantisation distortion $Q_p$ introduced by the quantiser in the first stage. The error Q3 introduced by an imperfect D-A converter 2 however will not be suppressed by the second stage and so must be kept as small as possible and within the quantisation distortion Q2 of the second stage if the full resolution of the complete converter is to be realised.

Figure 2:
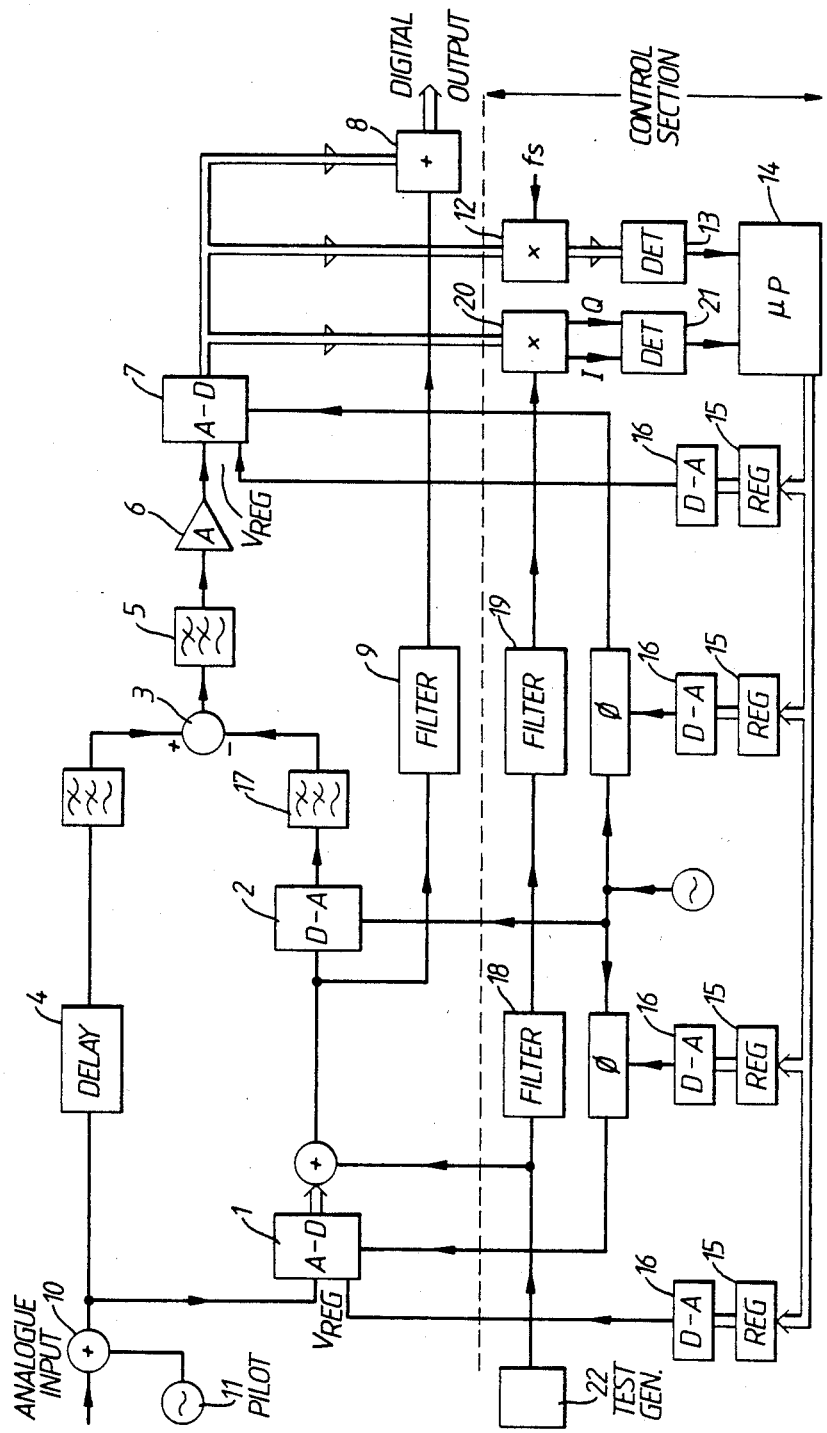

FIG. 2 illustrates in greater detail the converter of FIG. 1 and shows the path matching control arrangement.

Small adjustments of the phase can be made by controlling the phase of the 8 bit parallel A-D converter clocks relative to the D-A clock and adjustment of the gain by adjustment of the A-D reference voltage. The control can be carried out by means of updating a register, up or down, followed by a low speed (CMOS) 8 bit D-A converter in each case. Monitoring of the error condition differs for the two stages but in each case involves monitoring the signal level appearing at the second stage A-D converter output.

Matching of the first stage is achieved by insertion at 10 of a pilot tone from a generator 11 at the input of the arrangement. The phase of the sampling clock to the first A-D converter 1 and its gain are adjusted to minimise the component of the pilot tone in the prediction error $V_{pe}$. The pilot tone is at a level 20–30 dB below the maximum input capacity, and at a frequency near one edge of the system passband. The output from the second stage A-D 7 is sampled at 12 reducing the output to baseband. This is then filtered at 13 to a bandwidth of 500Hz or less to produce an indication of the amplitude of the component of the pilot tone present in the prediction error $V_{pe}$. The amplitude of the detected tone produced by detector 13 is passed to a microprocessor controller 14 carrying out a 'bridge balancing' control function to minimise the detected pilot level, via signals delivered to registers 15 which control the clock phase and gain of the A-D converters 1 and 7 via D-A converters 16. Should an input signal be present on the pilot tone frequency at a level in excess of the inserted pilot, the balancing mechanism can still operate and maintain cancellation at the pilot frequency.

Matching of the second stage is achieved by insertion of a digital test signal after the A-D converter 1 in the first stage and adjustment of the phase of the sampling clock to the second A-D converter 7 and its gain to minimise the component of the test signal appearing in the output signal $V_o$. The test signal is inserted at a level no greater than the first stage A-D quantum step size. This signal will pass through the path formed by D-A converter 2, a lowpass filter 17, subtractor 3, filter 5, amplifier 6 and the second stage A-D converter 7 and the path formed by filter 9, to adder 8. These paths should be equal for matching of the second stage loop. The test signal is also passed through a separate path through filters 18 and 19 which impose an identical delay on the test signal as is included in the path through the second stage before correlation with the output from the second stage A-D converter in a correlator 20. This avoids the main input signal component present in the path through filter 9 which would make detection at adder 8 of the test signal component difficult. The correlator 20 produces baseband in-phase and quadrature components which are applied to detector 21.

The form of the test signal from generator 22 is a pseudo random modulated signal occupying the signal passband. Correlation of the two signal paths enables the detection of the test signal to be achieved without undue interference from the system input signal components, thereby avoiding the need to interrupt the input signal during calibration.

Figure 3:
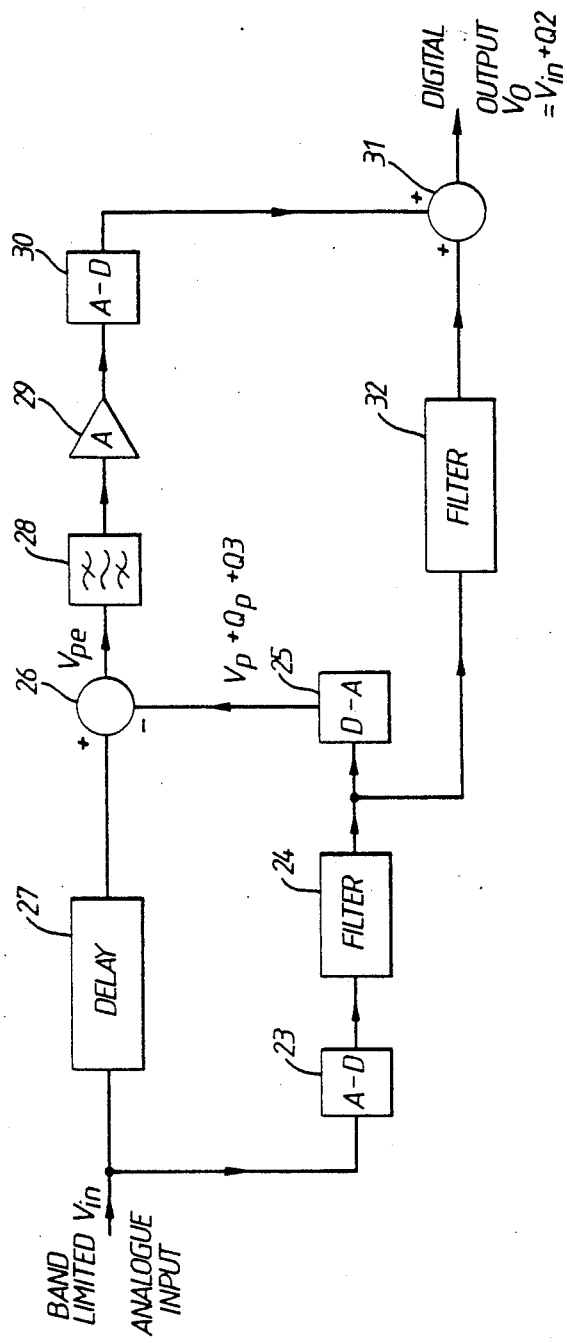
FIGS. 3 and 4 are schematic block diagrams of another converter in accordance with the invention.

With reference to FIG. 3, another analogue-to-digital converter is illustrated which is suitable for use with input signals of narrow bandwidth. The first stage of the converter includes an A-D converter 23 followed by a filter 22 and D-A converter 25, the output of which is the prediction signal $V_p$ in analogue form. This is subtracted from the analogue input signal $V_{in}$ at subtractor 26. The analogue input signal is applied to subtractor 26 via a delay 27 which is used to provide matching between the two paths in the first stage. The filter 24 and D-A converter 25 may be such that only a small residual delay 27 need be included and it may be that the delay 27 could be omitted altogether.

The digital filter 24 is chosen to minimise the prediction error $V_{pe}$ over a sufficiently wide bandwidth and in this example uses a combination of two and four sample period delays.

The digital to analogue converter 25 requires a resolution equal to that of the prediction A-D converter 23, i.e. 8 bits, with at least sixteen bit accuracy of levels. However, the digital filter 24 can be chosen to introduce a shaping of the quantisation noise spectrum associated with an internal discarding of bits, giving a null at the quarter sampling frequency to permit a reduced resolution D-A converter 25 to be used (but still with at least 16 bit level accuracy). In the limit the D-A converter resolution can be reduced to a single bit i.e. a simple switch, which removes the requirement for 16 bit level accuracy although jitter and settling time requirements remain unchanged.

It may be advantageous to place a null at baseband in addition to or in place of the null at the quarter sampling frequency.

The error signal from the subtractor 26 is transmitted via a bandpass filter 28 and amplifier 29 to an A-D converter 30. The output of the A-D converter 30 is combined at 31 with the digital prediction signal taken from the output of filter 24 and applied to adder 31 via a filter 32.

Figure 4:
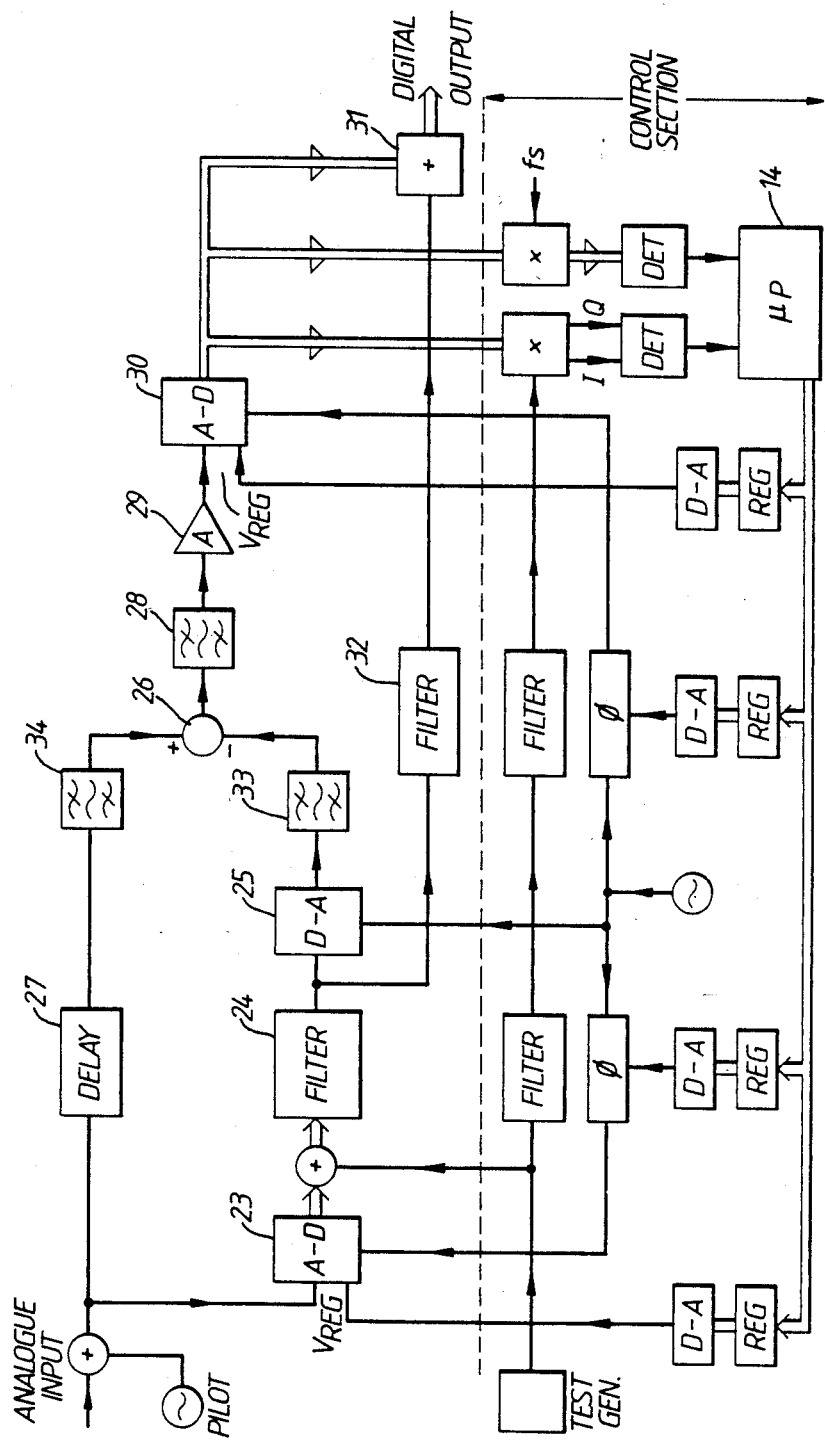

FIG. 4 shows the converter of FIG. 3 in greater detail and illustrates the matching arrangement which is similar to that of the converter shown in FIGS. 1 and 2. A bandpass filter 33 is arranged to follow the D-A converter 25 and removes out-of-band components and quantising noise produced by the D-A converter 25, so presenting the subtractor 26 with a clean band limited prediction of the input signal containing only the in band quantising noise. A matching filter 34 in the input signal path is included to assist phase and amplitude matching prior to subtraction at 26 and also to limit the amplitude of $V_{pe}$ for large out of band input signals. Again, the filter 28 provides further filtering to prevent overloading of amplifier 29 and the second A-D 30.

I claim:

1. An analogue-to-digital converter comprising: a first stage including means for producing a predicted signal in digital form of an analogue signal applied to its input, and means for determining a band limited error signal representing the difference between said predicted signal and said input signal by comparing them in unsampled analogue form; and a second stage comprising means for combining said error signal with said predicted signal to obtain a digital output signal.

2. An analogue-to-digital converter as claimed in claim 1 wherein said first stage includes: a first signal path along which said analogue signal is transmitted to said means for determining an error signal; and a second signal path which includes analogue-to-digital converter means followed by digital-to-analogue converter means, said predicted signal in ditigal form being arranged to be passed to said second stage and the output of said digital-to-analogue converter means being applied to said means for determining an error signal.

3. An analogue-to-digital converter as claimed in claim 2 wherein said analogue-to-digital converter means is a flash analogue-to-digital converter.

4. An analogue-to-digital converter as claimed in claim 1 wherein the said second stage comprises a first signal path which includes analogue-to-digital converter means to which said error signal is applied, and a second signal path along which said predicted signal in digital form is transmitted.

5. An analogue-to-digital converter as claimed in claim 4 wherein said analogue-to-digital converter means is a flash analogue-to-digital converter.

6. An analogue-to-digital converter as claimed in claim 1 and including means for adding a pilot signal to said analogue signal at the input of the converter; means for monitoring the amplitude of said pilot signal present in said error signal; and means for using the result of the monitoring to improve phase and amplitude matching between signal paths in said first stage.

7. An analogue-to-digital converter as claimed in claim 6 wherein matching between signal paths is improved by applying phase and gain control to elements in said signal paths in dependence on the result obtained.

8. An analogue-to-digital converter as claimed in claim 7 and wherein said elements are analogue-to-digital converter means and including means for controlling the clock phase and reference voltage of said elements.

9. An analogue-to-digital converter as claimed in claim 1 and including means for adding a test signal to said predicted signal in digital form in said first stage, means for comparing said test signal derived from said second stage with said test signal passed along a signal path not included in said first and second stages, and means for using the comparison result to improve phase and amplitude matching between signal paths in said second stage.

10. An analogue-to-digital converter as claimed in claim 9 wherein the characteristics of said path of said test signal derived from said second stage are substantially the same as those of said signal path not included in said first and second stages.

11. An analogue-to-digital converter as claimed in claim 9 wherein matching between signal paths is improved by applying phase and gain control to elements in said signal paths in dependence on the result obtained.

12. An analogue-to-digital converter as claimed in claim 11 wherein said elements are analogue-to-digital converter means and including means for controlling the clock phase and reference voltage of said elements to improve matching between signal paths.

13. An analogue-to-digital converter as claimed in claim 1 and including filter means in said first stage to which said predicted signal in digital form is applied.

14. An analogue-to-digital converter as claimed in claim 13 wherein the output noise spectrum of said filter means is arranged to be shaped so as to include a null around a quarter of the sampling frequency.

15. An analogue-to-digital converter as claimed in claim 13 wherein the output noise spectrum of said filter means is arranged to be shaped so as to include a null at baseband.

16. An analogue-to-digital converter as claimed in claim 15 wherein the output noise spectrum of said filter means is arranged to be shaped so as to include a null around a quarter of the sampling frequency.

17. An analogue-to-digital converter as claimed in claim 14 wherein digital-to-analogue converter means is arranged to follow said filter means and has a resolution less than that of a preceding analogue-to-digital converter means.

18. An analogue-to-digital converter as claimed in claim 17 wherein said digital-to-analogue converter means following said filter means has one bit resolution.

19. An analogue-to-digital converter as claimed in claim 15 wherein digital-to-analogue converter means is arranged to follow said filter means and has a resolution less than that of a preceding analogue-to-digital converter means.

20. An analogue-to-digital converter as claimed in claim 19 wherein said digital-to-analogue converter means following said filter means has one bit resolution.

21. An analogue-to-digital converter as claimed in claim 1 and including in the first stage delay means via which said analogue input signal is transmitted to the means for determining said error signal.

22. An analogue-to-digital converter comprising: a first stage including means for producing a predicted signal in digital form of an analogue signal at its input, and means for determining a band limited error signal representing the difference between said predicted signal and said input signal by comparing them in analogue form; said first stage including: a first signal path along which said analogue signal is transmitted to said means for determining an error signal; and a second signal path which includes analogue-to-digital converter means followed by digital-to-analogue converter means, said predicted signal in digital form being arranged to be passed to said second stage and the output of said digital-to-analogue converter means being applied to said means for determining an error signal;

and a second stage comprising means for combining said error signal with said predicted signal to obtain a digital output signal, said second stage including a first signal path which includes analogue-to-digital converter means to which said error signal is applied, and a second signal path along which said predicted signal in digital form is transmitted.

23. An analogue-to-digital converter as claimed in claim 22 wherein said analogue-to-digital converter means are flash analogue-to-digital converters.

24. An analogue-to-digital converter as claimed in claim 22 and including means for adding a pilot signal to said analogue signal at the input of the converter; means for monitoring the amplitude of said pilot signal present in said error signal; and means for using the result of the monitoring to improve phase and amplitude matching between signal paths in said first stage.

25. An analogue-to-digital converter as claimed in claim 24 and including means for adding a test signal to said predicted signal in digital form in said first stage, means for comparing said test signal derived from said second stage with said test signal passed along a signal path not included in said first and second stages, and means for using the comparison result to improve phase and amplitude matching between signal paths in said seond stage.

26. An analogue-to-digital converter as claimed in claim 22 and including filter means in said first stage to which the predicted signal in digital form is applied.

27. An analogue-to-digital converter as claimed in claim 26 wherein the output noise spectrum of said filter means is arranged to be shaped so as to include a null around a quarter of the sampling frequency.

28. An analogue-to-digital converter as claimed in claim 26 wherein the output noise spectrum of said filter means is arranged to be shaped so as to include a null at baseband.

29. An analogue-to-digital converter as claimed in claim 27 wherein digital-to-analogue converter means is arranged to follow said filter means and has a resolution less than that of the preceding analogue-to-digital converter means.

* * * * *